United States Patent
Patel et al.

(10) Patent No.: US 11,617,260 B2
(45) Date of Patent: Mar. 28, 2023

(54) MULTI-BOARD MID-PLANE PROVIDING SUPERIOR THERMAL PERFORMANCE, ENHANCED CONNECTOR PLACEMENT, AND ENHANCED ELECTRICAL SIGNAL TRACE ROUTING CHANNELS

(71) Applicant: Flex Ltd., Singapore (SG)

(72) Inventors: Ketan K. Patel, Campbell, CA (US); Sashi J. Vijayan, Austin, TX (US); Jeffrey H. Gruger, Addison, TX (US); Wen Tien Wang, New Taipei (TW); Po-Jen Huang, San Jose, CA (US); Shih-ming Wan, New Taipei (TW); Yi Chen Chang, New Taipei (TW); Chi Sheng Liu, New Taipei (TW)

(73) Assignee: Flex Ltd., Singapore (SG)

( * ) Notice: Subject to any disclaimer, the term of this patent is extended or adjusted under 35 U.S.C. 154(b) by 35 days.

(21) Appl. No.: 17/315,802

(22) Filed: May 10, 2021

(65) Prior Publication Data
US 2021/0349503 A1   Nov. 11, 2021

Related U.S. Application Data

(60) Provisional application No. 63/022,738, filed on May 11, 2020.

(51) Int. Cl.
*H05K 1/02* (2006.01)

(52) U.S. Cl.
CPC .................. *H05K 1/0272* (2013.01)

(58) Field of Classification Search
CPC ......... G06F 1/20; G06F 1/186; H05K 7/1445; H05K 1/0272; H05K 7/1422; G11B 33/142; G11B 33/1413
See application file for complete search history.

(56) References Cited

U.S. PATENT DOCUMENTS

| | | | | |
|---|---|---|---|---|
| 7,193,861 B2 * | 3/2007 | Uzuka | ..................... | G06F 1/184 439/64 |
| 9,167,725 B2 * | 10/2015 | Chen | ....................... | H05K 7/20 |
| 11,269,386 B2 * | 3/2022 | Sun | ..................... | H05K 7/20145 |

* cited by examiner

Primary Examiner — James Wu
(74) *Attorney, Agent, or Firm* — Sheridan Ross P.C.

(57) ABSTRACT

A multi-board mid-plane includes a disk backplane board (DBB) having a front side and a rear side. Venting holes are provided within the DBB extending between the front side of the DBB and the rear side of the DBB. The multi-board mid-plane also includes a controller backplane board (CBB) having a front side and a rear side. The front side of the CBB includes venting holes provided within the CBB extending between the front side of the CBB and the rear side of the CBB. A top fabric plane board (TFPB) and a bottom fabric plane board (BFPB) are provided for connecting the DBB with the CBB. A combination of the DBB and the CBB has a venting ratio that is equal to a lower of the venting ratio of the DBB and the venting ratio of the CBB.

20 Claims, 10 Drawing Sheets

MULTI-BOARD MID-PLANE PROVIDING SUPERIOR THERMAL PERFORMANCE, ENHANCED CONNECTOR PLACEMENT, AND ENHANCED ELECTRICAL SIGNAL TRACE ROUTING CHANNELS

CROSS REFERENCE TO RELATED APPLICATIONS

The present application claims the benefit of priority, under 35 U.S.C. § 119, to U.S. Provisional Application Ser. No. 63/022,738, filed May 11, 2020, entitled "THREE-DIMENSIONAL MIDPLANE DESIGN TO ENHANCE AIRFLOW THROUGH SOLID-STATE DRIVE (SSD) DEVICES," the entire disclosure of which is hereby incorporated herein by reference, in its entirety, for all that it teaches and for all purposes.

FIELD

The present disclosure is generally directed to a multi-board mid-plane providing superior thermal performance, enhanced connector placement, and enhanced electrical signal trace routing channels.

BACKGROUND

In a typical server computer or storage chassis, a single-board mid-plane housed within the chassis typically will not have sufficient surface area on its printed circuit board (PCB) to support a large number of connectors. This is especially true if the connectors are required to be mounted on both sides of the single-board mid-plane. Also, the single-board mid-plane significantly restricts routing channels for electrical signal traces on its PCB, when mechanical components such as connectors, consume a significant amount of space on the single-board mid-plane. Moreover, the single-board mid-plane loses valuable venting hole areas, which are critical for better thermal performance, when a large number of connectors are present on both sides of the single-board mid-plane. A venting ratio is the ratio of the area occupied by cavities on a PCB, to the overall area of the PCB surface including the cavities. The venting ratio determines how much air can pass through a mid-plane within the chassis, and a higher venting ratio provides superior thermal performance.

Conventional techniques address these issues by reducing the number and/or the size of connectors placed on the single-board mid-plane. There, however, remains a need for a mid-plane that can support a large number of connectors on both of its sides while at the same time, increasing the surface area designated for routing channels and improving the venting ratio.

SUMMARY

At least one example embodiment of the present disclosure is directed to a multi-board mid-plane. The multi-board mid-plane includes a disk backplane board (DBB) having a front side and a rear side. The front side of the DBB includes slots for accommodating disk connectors and the rear side of the DBB includes slots for accommodating bridge connectors. Venting holes are provided within the DBB extending between the front side of the DBB and the rear side of the DBB. The multi-board mid-plane also includes a controller backplane board (CBB) having a front side and a rear side. The front side of the CBB includes slots for accommodating controller connectors and the rear side of the CBB includes slots for accommodating bridge connectors and venting holes are provided within the CBB extending between the front side of the CBB and the rear side of the CBB. A connection mechanism is provided for connecting the DBB with the CBB. A combination of the DBB and the CBB has a venting ratio that is equal to a lower of the venting ratio of the DBB and the venting ratio of the CBB.

At least one example embodiment of the present disclosure is directed to a method. The method includes attaching a bottom fabric plane board (BFPB) to a bottom row of bridge signal connectors of a controller backplane board (CBB) and attaching a top fabric plane board (TFPB) to a top row of bridge connectors of the CBB. The method also includes fitting a top row of bridge signal connectors, a top row of bridge power connectors, a bottom row of bridge signal connectors and a bottom row of bridge power connectors of a disk backplane board (DBB) onto the TFPB and the BFPB.

At least one example embodiment of the present disclosure is directed to a multi-board mid-plane. The multi-board mid-plane includes a disk backplane board (DBB) having a front side and a rear side. Venting holes are provided within the DBB extending between the front side of the DBB and the rear side of the DBB. The multi-board mid-plane also includes a controller backplane board (CBB) having a front side and a rear side. The front side of the CBB includes venting holes provided within the CBB extending between the front side of the CBB and the rear side of the CBB. A top fabric plane board (TFPB) and a bottom fabric plane board (BFPB) are provided for connecting the DBB with the CBB. A combination of the DBB and the CBB has a venting ratio that is equal to a lower of the venting ratio of the DBB and the venting ratio of the CBB.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosed herein. It will be apparent, however, to one skilled in the art that various embodiments of the present disclosure may be practiced without some of these specific details. The ensuing description provides exemplary embodiments only and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

Figure 1:
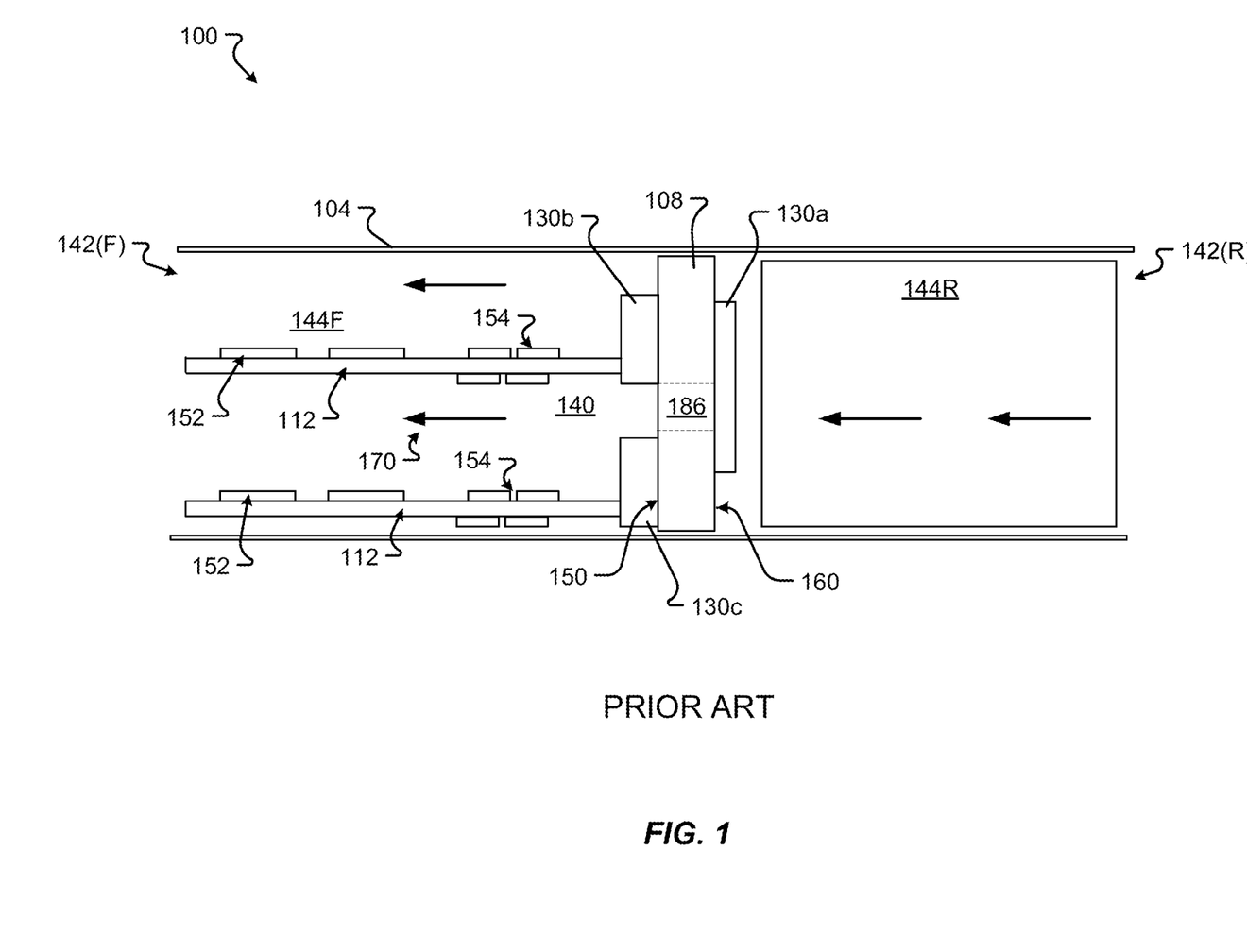
FIG. 1 is a cross-sectional side view of an electronic system having a conventional single-board mid-plane illustrating airflow and connectors.

FIG. 1 is a cross-sectional side view of an electronic system 100 incorporating a conventional single-board mid-plane illustrating airflow and connectors. As shown, the electronic system 100 includes a chassis 104, a single-board mid-plane 108, and a variety of modules 112 (e.g., motherboards, daughter cards, etc.) including for example processors 152, semiconductor memories 154, as well as other circuitry. The single-board mid-plane 108 includes a first side 150 and a second side 160 and a variety of connectors 130a-130c. As an example, connector 130a may include a disk connector while connectors 130b and 130c may include controller connectors used for connection to the modules 112. The chassis 104 defines an internal space 140, a front opening 142(F) and a rear opening 142(R). The chassis 104 is arranged to support the single-board mid-plane 108 in a substantially vertical orientation within the internal space 140 in a manner that partitions the internal space 140 into a front cavity 144(F) which is accessible through the front opening 142(F) and a rear cavity 144(R) which is accessible through the rear opening 142(R). The front cavity 144(F) may be defined as the controller area while the rear cavity 144(R) may be defined as the disk area. As illustrated in FIG. 1, the airflow 170 is limited when connectors 130a-130c are placed on both sides 150 and 160 of the single-board mid-plane 108. Therefore, venting holes 186 may be limited in number and small in size.

Figure 2A:
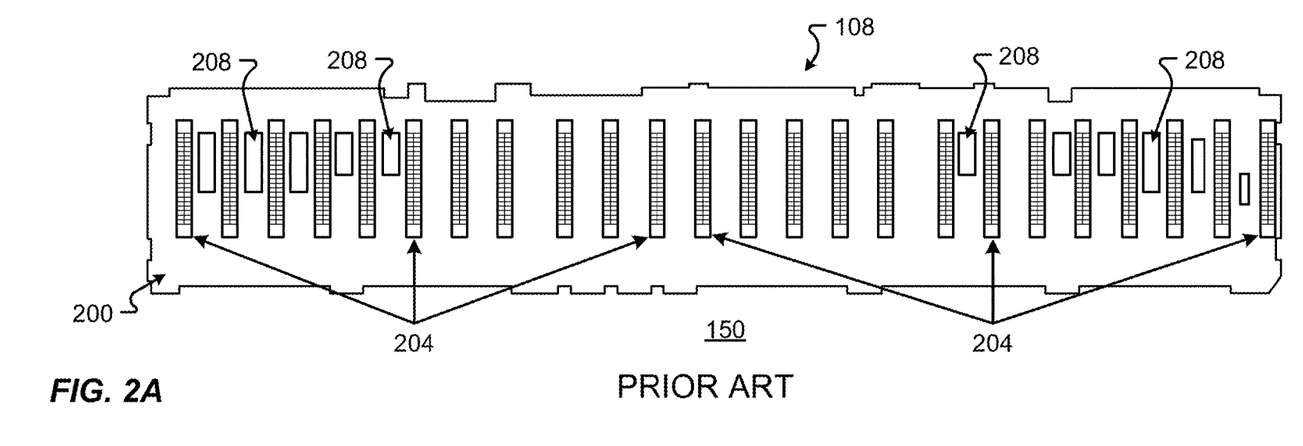
FIG. 2A illustrates a view of a front side of a conventional single-board mid-plane.

FIG. 2A illustrates a view of the front side 150 of the conventional single-board mid-plane 108. As illustrated in FIG. 2A, the front side 150 of the single-board mid-plane 108 includes a printed circuit board (PCB) 200, a variety of connector slots that accommodate a variety of connectors 204 and a variety of venting holes 208. Connectors 204 may include disk connectors for example. The connectors 204 are dispersed across the front side 150 of the single-board mid-plane 108 in the horizontal direction while the venting holes 208 are provided at end portions of the front side 150 of the single-board mid-plane 108.

Figure 2B:
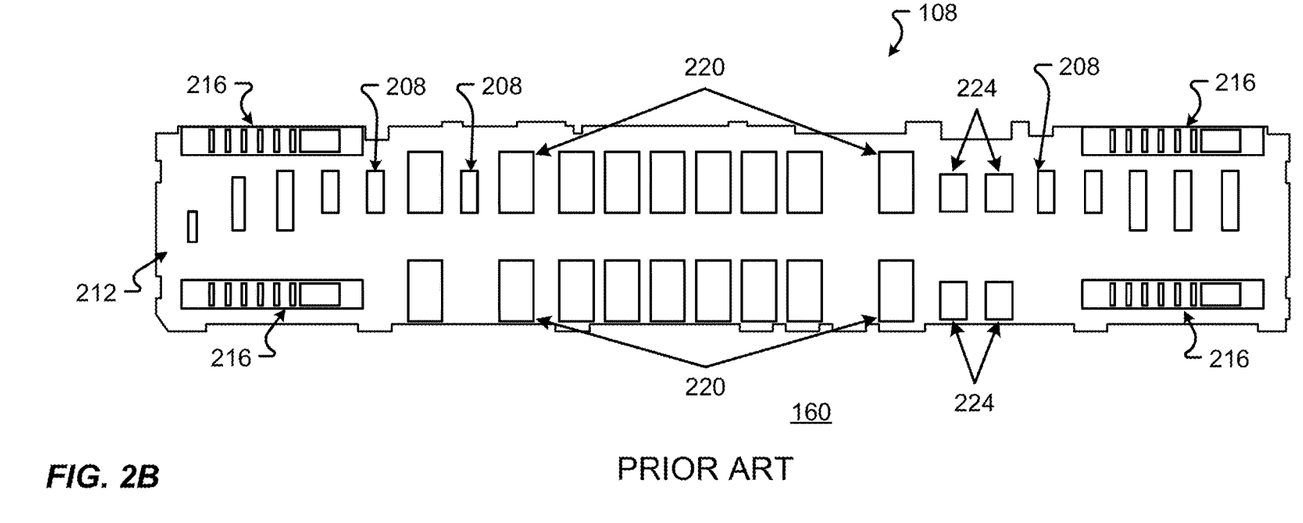
FIG. 2B illustrates a view of a rear side of a conventional single-board mid-plane.

FIG. 2B illustrates a view of the rear side 160 of the conventional single-board mid-plane 108. As illustrated in FIG. 2B, the rear side 160 of the single-board mid-plane 108 includes a PCB 212, a variety of connector slots that accommodate a variety of connectors 216, 220, 224 and the variety of venting holes 208. Connectors 216, 220, 224 may include controller connectors for example. The variety of connectors 216, 220, 224 and the variety of venting holes 208 are dispersed across the PCB 212 in the horizontal direction with a large concentration of the connectors 220 provided in a central portion of the rear side 160 of the single-board mid-plane 108. The connectors 216 are provided at top and bottom corner portions of the rear side 160 of the single-board mid-plane 108. Connectors 224 are provided between the connectors 220 and one set of the connectors 216. With this arrangement of the connectors 216, 220, 224, there is very little room left for the venting holes 208.

Figure 2C:
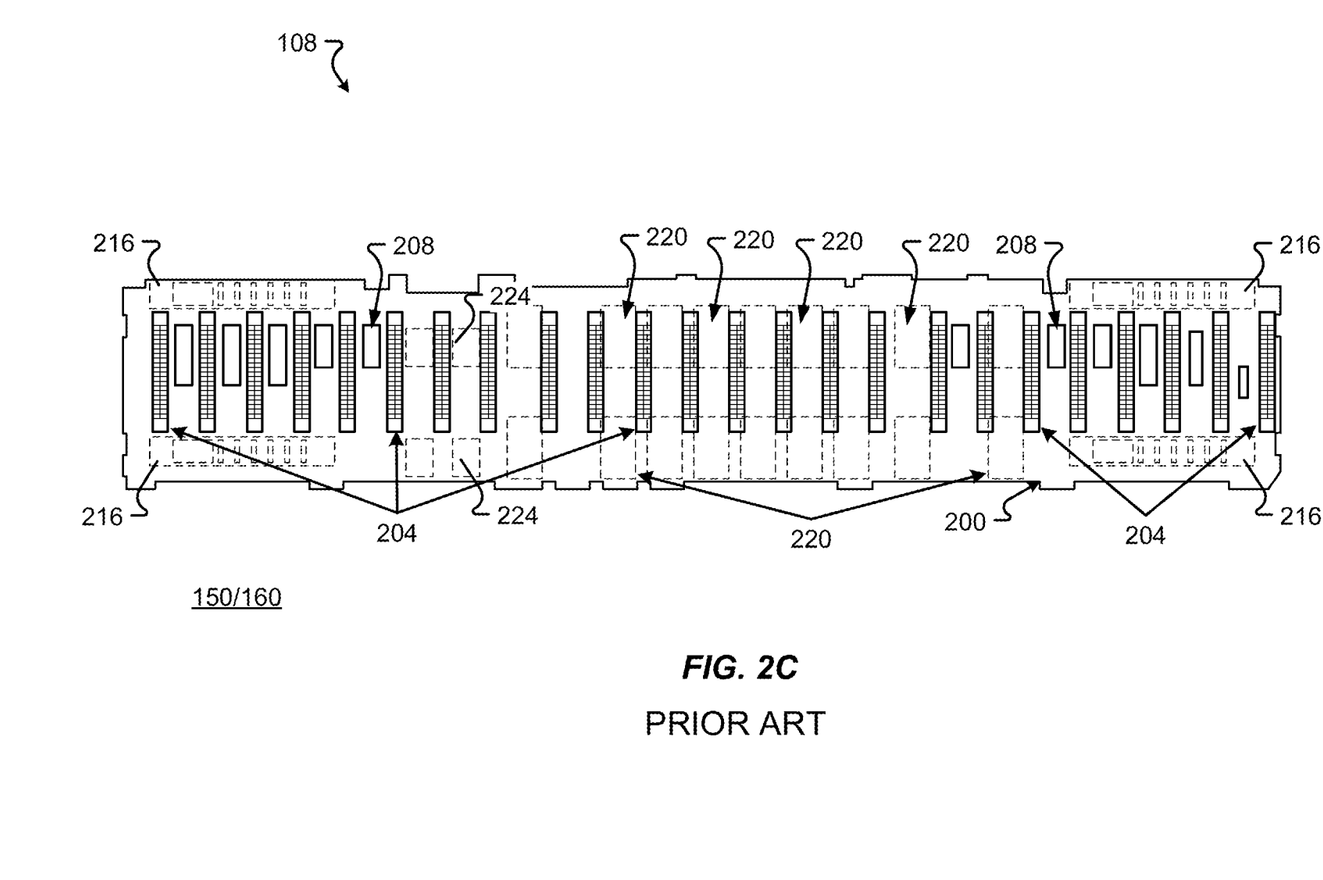
FIG. 2C illustrates a view of a combined front side and rear side of a conventional single-board mid-plane.

FIG. 2C illustrates a view of a combined front side 150 and rear side 160 of the conventional single-board mid-plane 108. As illustrated in FIG. 2C, connectors 204 are provided on the front side 150 of the single-board mid-plane 108. Hash lines depict the rear side 160 of the single-board mid-plane 108 and the locations of the connectors 216, 220, 224 provided on the rear side 160 of the single-board mid-plane 108. With the arrangements of the connectors 204, 216, 220, 224 provided on both the front side 150 and the rear side 160 of the single-board mid-plane 108, the number and the size of the venting holes 208 that can be accommodated on the single-board mid-plane 108 is limited. Moreover, there is also limited space for electrical signal trace routing channels by incorporating the large number of the connectors 204, 216, 220, 224 on both the front side 150 and the rear side 160 of the single-board mid-plane 108. Therefore, a venting ratio of the conventional single-board mid-plane 108 arranged with the connectors 204, 216, 220, 224 placed on both the front side 150 and the rear side 160 would only be around 10.20% or less.

Figure 3A:
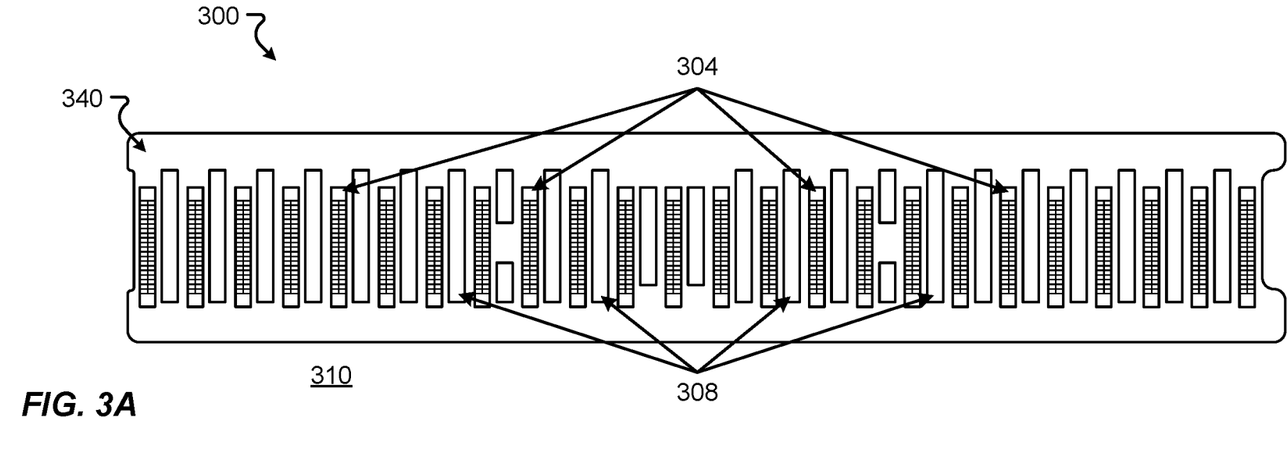
FIG. 3A illustrates a view of a front side of a disk backplane board (DBB) of the multi-board mid-plane according to one embodiment of the present disclosure.
Figure 4B:
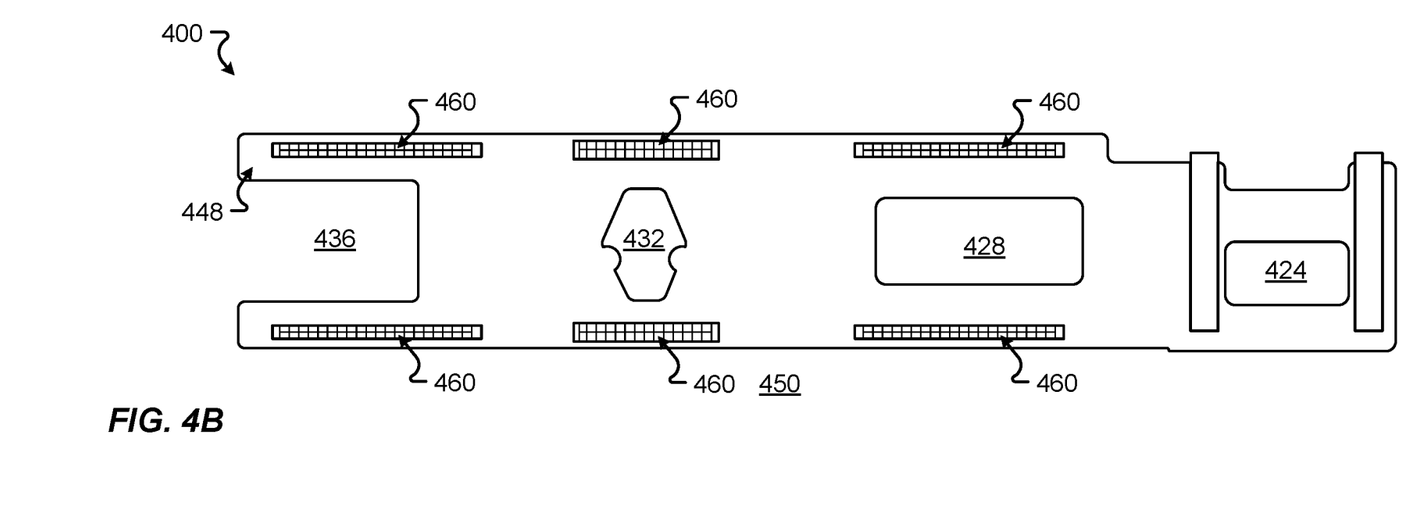
FIG. 4B illustrates a view of a rear side of the CBB of the multi-board mid-plane according to one embodiment of the present disclosure.
Figure 5A:
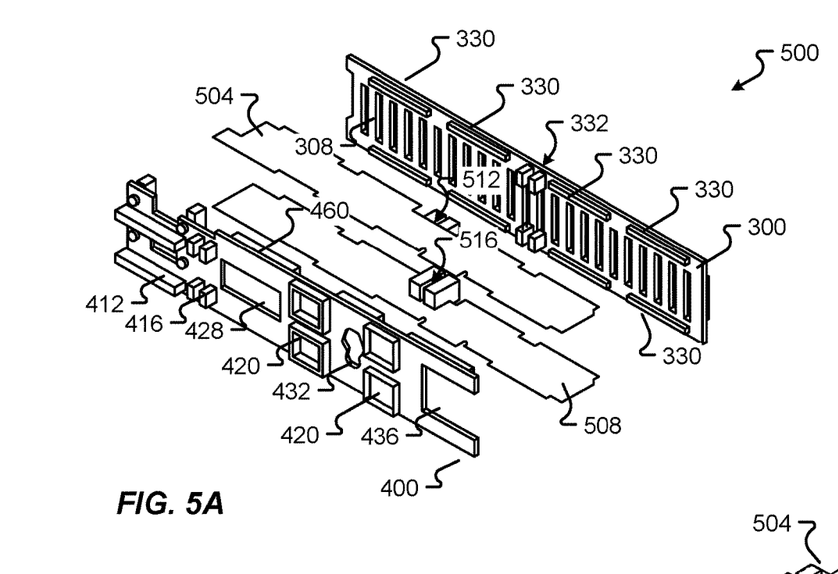
FIG. 5A is a perspective view illustrating an unassembled multi-board mid-plane according to one embodiment of the present disclosure.
Figure 5B:
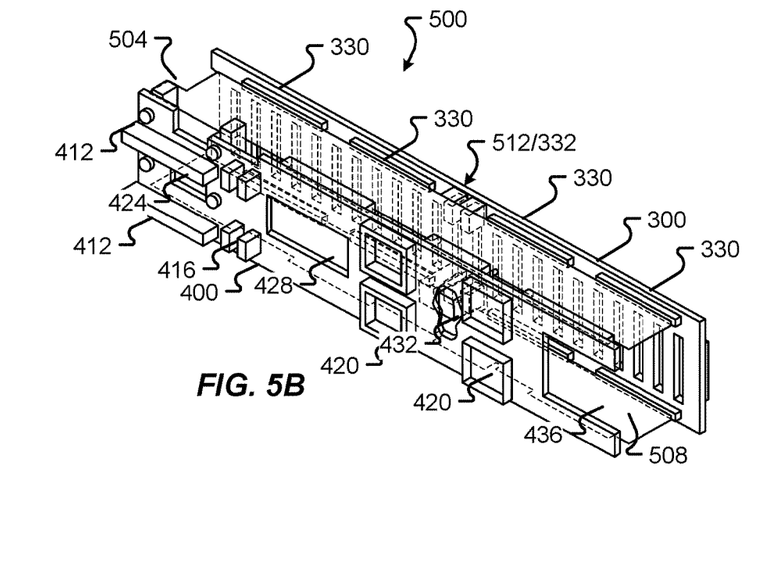
FIG. 5B is a perspective view illustrating an assembled multi-board mid-plane according to one embodiment of the present disclosure.

FIG. 5A is a perspective view illustrating an unassembled multi-board mid-plane 500 and FIG. 5B is a perspective view illustrating an assembled multi-board mid-plane 500 according to embodiments of the present disclosure. The multi-board mid-plane 500 includes a disk backplane board (DBB) 300, a controller backplane board (CBB) 400, a top fabric plane board (TFPB) 504 and a bottom fabric plane board (BFPB) 508. The DBB 300 includes bridge connectors 330, 332 as well as disk connectors (as shown in FIG. 3A). The CCB 400 also includes bridge connectors (as shown in FIG. 4B) as well as controller connectors 412, 416, 420.

The TFPB 504 includes a bridge power connector 512 and the BFPS 508 includes a bridge power connector 516. The DBB 300 and the CBB 400 are discussed in greater detail with FIGS. 3A and 3B and FIGS. 4A and 4B, respectively. According to one embodiment of the present disclosure, the DBB 300 and the CBB 400 are each a rigid board oriented in the vertical direction. The TFPB 504 and the BFPB 508 are also rigid boards with the TFPB 504 and the BFPB 508 each being less rigid than each of the DBB 300 and the CBB 400. Moreover, a thickness of each of the TFPB 504 and the BFPB 508 is less than a thickness of each of the DBB 300 and the CBB 400. According to one embodiment of the present disclosure, the DBB 300 and the CBB 400 have fewer PCB layers as compared with the conventional single-board mid-plane. The CBB 400 only supports connectors from the controllers within the chassis with the remaining areas within the chassis available for creating venting holes. The DBB 300 only supports connectors from the disks within the chassis with the remaining area available for creating venting holes. With this arrangement of the DBB 300 and the CBB 400, more venting holes are available for the DBB 300 and the CBB 400 individually and collectively.

According to embodiments of the present disclosure, the TFPB 504 and the BFPB 508 are also rigid boards. These rigid boards are oriented in the horizontal direction and are provided for bridging or interconnecting the DBB 300 and the CBB 400 together. Moreover, the TFPB 504 and the BFPB 508 provide mechanical and electrical interfaces between the DBB 300 and the CBB 400. As illustrated in FIG. 5B, the DBB 300 and the CBB 400 are physically and electrically coupled to each other via the TFPB 504 and the BFPB 508 as discussed in greater detail in FIG. 8.

FIG. 3A illustrates a view of the front side 310 of the DBB 300 of the multi-board mid-plane 500 according to one embodiment of the present disclosure. As used herein, the front side 310 of the DBB 300 refers to the side opposite the side having bridge signal connectors and bridge power connectors for connecting the DBB 300 with the CBB 400 via the TFPB 504 and the BFPB 508. As illustrated in FIG. 3A, the front side 310 of the DBB 300 includes a PCB 340, a variety of connector slots that accommodate a variety of connectors 304 and a variety of venting holes 308. Connectors 304 may include disk connectors for example. The connectors 304 and the venting holes 308 are dispersed, in an alternating fashion, across the front side 310 of the DBB 300 of the multi-board mid-plane 500 in the horizontal direction. Therefore, there are just as many venting holes 308 as there are connectors 304.

Figure 3B:
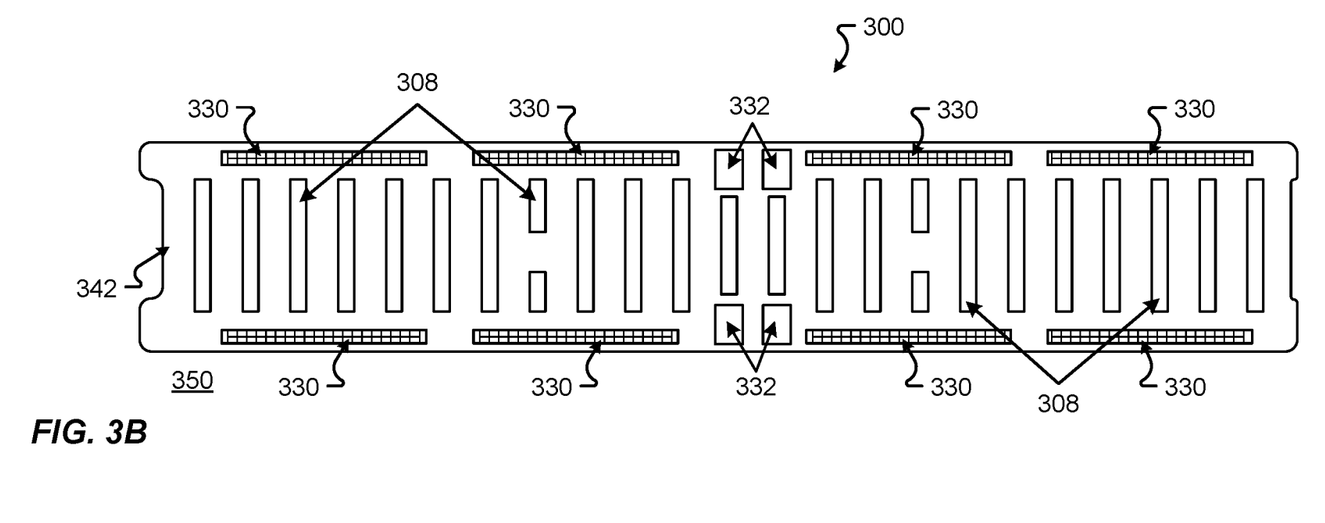
FIG. 3B illustrates a view of a rear side of the DBB of the multi-board mid-plane according to one embodiment of the present disclosure.

FIG. 3B illustrates a view of the rear side 350 of the DBB 300 of the multi-board mid-plane 500 according to one embodiment of the present disclosure. As illustrated in FIG. 3B, the rear side 350 of the DBB 300 of the multi-board mid-plane 500 includes a PCB 342, bridge signal connectors 330, bridge power connectors 332 and the venting holes 308. The bridge signal connectors 330 and the venting holes 308 are dispersed across the PCB 342 in the horizontal direction while the bridge power connectors 332 are dispersed across the PCB 342 in the horizontal and vertical directions. According to embodiments of the present disclosure, the bridge signal connectors 330 support signal connections for the multi-board mid-plane 500 while the bridge power connectors 332 support power and ground connections for the multi-board mid-plane 500.

Although four bridge power connectors 332 are shown at top and bottom portions at substantially central locations of the rear side 350 of the DBB 300, fewer or more bridge power connectors 332 may be provided at the same locations as well as other locations on the rear side 350 of the DBB 300 of the multi-board mid-plane 500. For example, fewer or more bridge power connectors 332 may be provided at top and bottom end portions of the rear side 350 of the DBB 300 of the multi-board mid-plane 500, without departing from the spirit and scope of the present disclosure. According to one embodiment of the present disclosure, providing the bridge power connectors 332 at top and bottom portions at substantially central locations of the rear side 350 of the DBB 300 provides for easier power and ground-plane routing.

As illustrated in FIG. 3B, the bridge signal connectors 330 extend across the top and bottom portions of the rear side 350 of the DBB 300. With this arrangement of the bridge signal connectors 330 and the bridge power connectors 332, none of the venting holes 308 are blocked. Therefore, according to one embodiment of the present disclosure, by not blocking any of the venting holes 308 illustrated in FIGS. 3A and 3B, the DBB 300 has a venting ratio in the range of 25% to 30% and more specifically in the range of 28% to 29% with an approximate value of 28.20%.

Figure 4A:
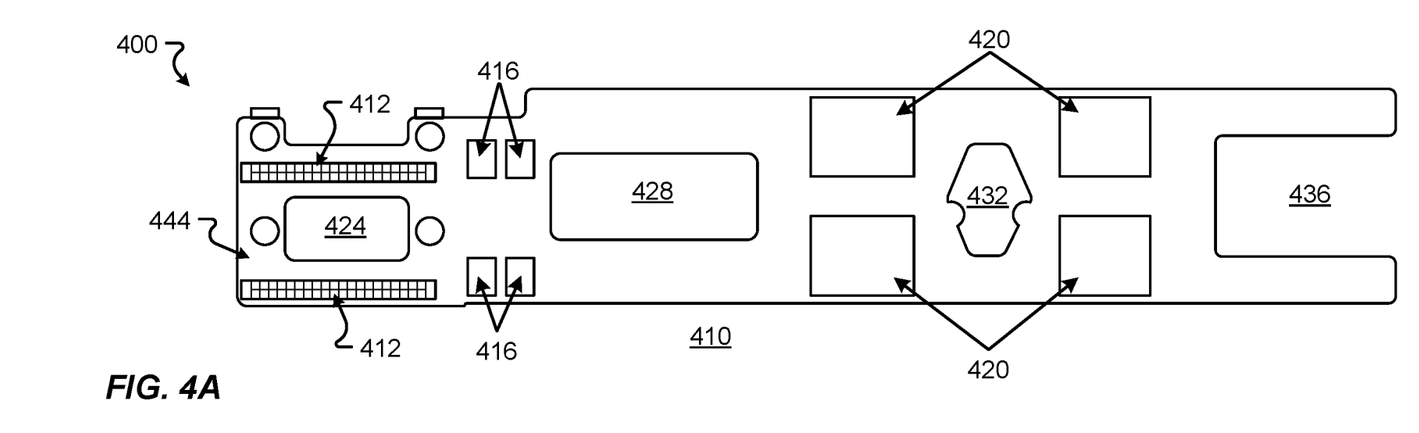
FIG. 4A illustrates a view of a front side of a controller backplane board (CBB) of the multi-board mid-plane according to one embodiment of the present disclosure.

FIG. 4A illustrates a view of the front side 410 of the CBB 400 of the multi-board mid-plane 500 according to one embodiment of the present disclosure. As used herein, the front side 410 of the CBB 400 refers to the side opposite the side having the bridge signal connectors for connecting the DBB 300 with the CBB 400 via the TFPB 504 and the BFPB 508. As illustrated in FIG. 4A, the front side 410 of the CBB 400 includes a PCB 444, a variety of connector slots that accommodate a variety of connectors 412, 416, 420 and a variety of venting holes 424, 428, 432, 436. The variety of connectors 412, 416, 420 and the variety of venting holes 424, 428, 432, 436 are dispersed across the PCB 444 in the horizontal direction.

FIG. 4B illustrates a view of the rear side 450 of the CBB 400 of the multi-board mid-plane 500 according to one embodiment of the present disclosure. As illustrated in FIG. 4B, the rear side 450 of the CBB 400 of the multi-board mid-plane 500 includes a PCB 448, bridge signal connectors 460 and a variety of venting holes 424, 428, 432, 436. The bridge signal connectors 460 and the variety of venting holes 424, 428, 432, 436 are dispersed across the PCB 448 in the horizontal direction. The bridge signal connectors 460 extend across the top and bottom portions of the rear side 448 of the CBB 400. With this arrangement of the bridge signal connectors 460, none of the venting holes 424, 428, 432, 436 are blocked. Therefore, according to one embodiment of the present disclosure, by not blocking any of the venting holes 424, 428, 432, 436 illustrated in FIGS. 4A and 4B, the CBB 400 has a venting ratio in the range of 35% to 40% and more specifically in the range of 36% to 37% with an approximate value of 36.90%.

Figure 4C:
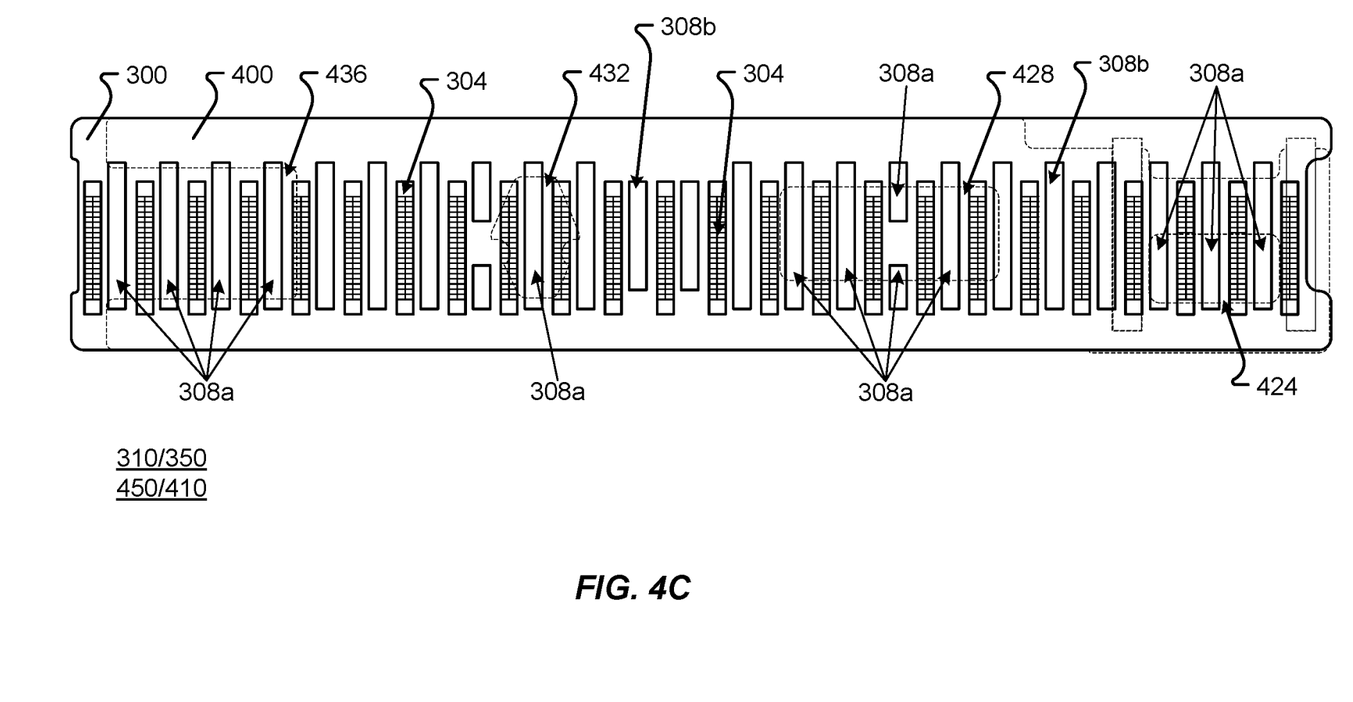
FIG. 4C illustrates a view of a combined front side and a rear side of the multi-board mid-plane according to one embodiment of the present disclosure.

FIG. 4C illustrates a view of a combined front side 310 and rear side 350 of the DBB 300 and rear side 450 and front side 410 of the CBB 400, in that order, of the multi-board mid-plane 500 according to one embodiment of the present disclosure. As illustrated in FIG. 4C, connectors 304 and venting holes 308a and 308b are provided, in an alternating fashion, across the front side 310 of the DBB 300 of the multi-board mid-plane 500. Hash lines depict the rear side 450 of the CBB 400 of the multi-board mid-plane 500 and the locations of the venting holes 424, 428, 432, 436 provided on the rear side 450 of the CBB 400 of the multi-board mid-plane 500.

As illustrated in FIG. 4C, although venting holes 308b may be block by the surface of the CCB 400 as air travels from the DBB 300 towards the CBB 400, portions of the venting holes 308a that overlap with the venting holes 424, 428, 432, 436 are not blocked as air travels from the DBB 300 towards the CBB 400. As compared with the venting holes 208 illustrated in FIG. 2C, the venting holes 308a that are not blocked by the CBB 400 of the multi-board mid-plane 500 are larger and are greater in number than the venting holes 208 provided in the single-board mid-plane 108. According to one embodiment of the present disclosure, with the venting holes 308a illustrated in FIG. 4C, the multi-board mid-plane 500 has a venting ratio in the range of 25% to 30% and more specifically in the range of 28% to 29% with an approximate value of 28.20%.

According to further embodiments of the present disclosure, the thermal performance of chassis components with the single-board mid-plane design compared with the multi-board mid-plane design shows that the multi-board mid-plane design has a higher thermal performance profile due to the improved venting ratio as discussed above.

Tables 1 and 2 illustrated below provide a comparison between thermal performances for key components within a server computer or storage chassis using a single-board mid-plane design (Table 1) verses a multi-board mid-plane design (Table 2). Both designs consume the same vertical cross-sectional area within the chassis. Both the single-board mid-plane design and the multi-board mid-plane design are identical in mechanical structure and electrical operation. The operating conditions for both designs include a storage server with 2 central processing unit (CPU)s, 32 dual in-line memory module (DIMM)s, 24 NVMe® solid-state drive (SSD)s, 2 power supply unit (PSU)s and 10 fans. The designs were tested at an ambient temperature of less than 35° C.

TABLE 1

Single-Board Mid-Plane Design

| Component | Maximum Temperature (C.) | Maximum Temperature Observed (C.) | Maximum Temperature Margin (C.) | Result |
| --- | --- | --- | --- | --- |
| CPU 0 | 89 | 103.20 | −14.20 | FAIL |
| CPU 1 | 89 | 103.40 | −14.40 | FAIL |

TABLE 1-continued

Single-Board Mid-Plane Design

| Component | Maximum Temperature (C.) | Maximum Temperature Observed (C.) | Maximum Temperature Margin (C.) | Result |
| --- | --- | --- | --- | --- |
| DIMM (worst-case) | 85 | 94.00 | −9.00 | FAIL |

TABLE 2

Multi-Board Mid-Plane Design

| Component | Maximum Temperature (C.) | Maximum Temperature Observed (C.) | Maximum Temperature Margin (C.) | Result |
| --- | --- | --- | --- | --- |
| CPU 0 | 89 | 87.60 | 1.40 | PASS |
| CPU 1 | 89 | 87.70 | 1.30 | PASS |
| DIMM (worst-case) | 85 | 980.80 | 4.20 | PASS |

As indicated by the results in Table 1 above, the single-board mid-plane design within the chassis results in negative temperature margins for the three key components, namely the CPU 0, the CPU 1, and the worst-case DIMM. This results in the single-board mid-plane design failing to meet thermal performance requirements. As indicated by the results in Table 2 above, the multi-board mid-plane design within the chassis results in positive temperature margins for the same key components, namely the CPU 0, the CPU 1 and the worst-case DIMM.

Figure 6:
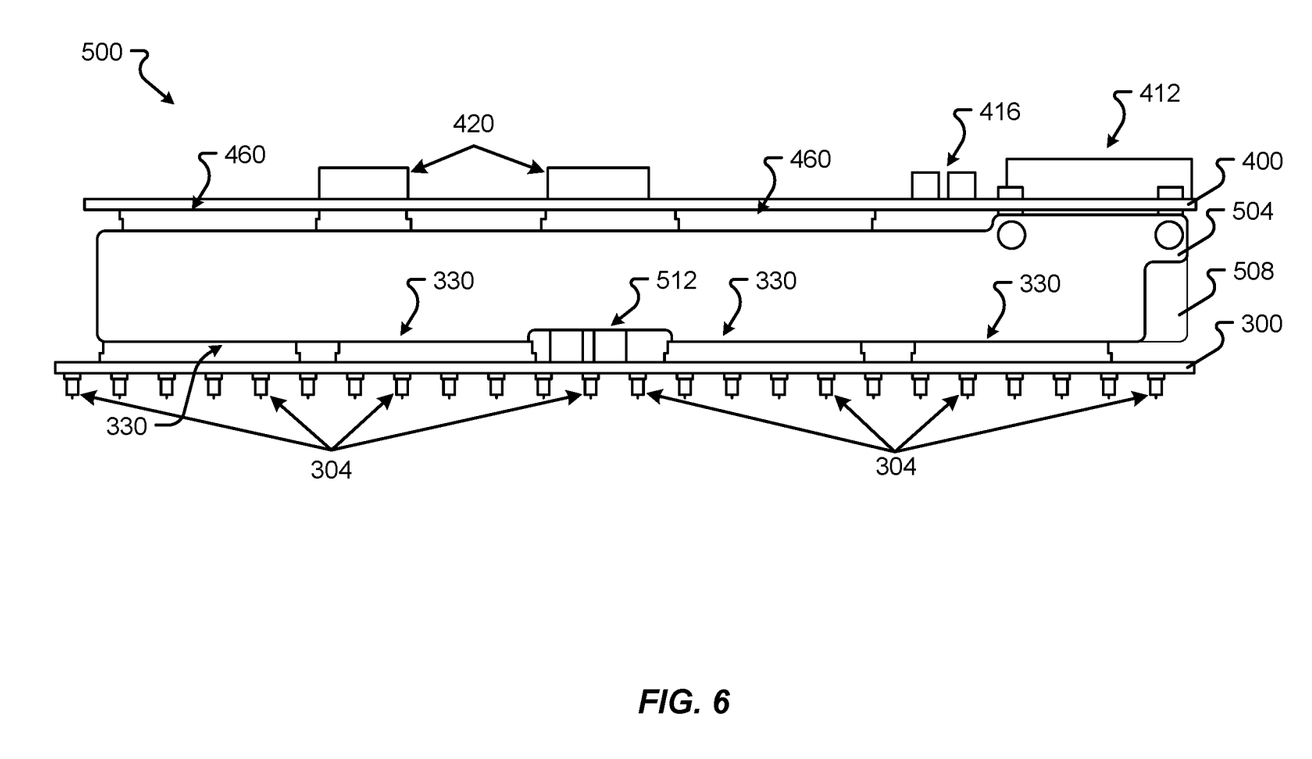
FIG. 6 illustrates a top view of the multi-board mid-plane according to one embodiment of the present disclosure.

FIG. 6 illustrates a top view of the multi-board mid-plane 500 according to one embodiment of the present disclosure. As illustrated in FIG. 6, the DBB 300 is connected to the CBB 400 via the TFPB 504 and the BFPB 508. The TFPB 504 and the BFPB 508 are provided to fit snug with the bridge signal connectors 330 of the DBB 300 and the bridge signal connectors 460 of the CBB 400. Moreover, the bridge power connector 512 of the TFPB 504 and the bridge power connector 516 of the BFPB 508 are provided to mate with the bridge power connectors 332 of the DBB 300. According to embodiments of the present disclosure, the TFPB 504 and the BFPB 508 each includes a PCB, and each can accommodate a variety of connectors, electrical components, and electrical signal trace routing channels. As an exemplary embodiment of the present disclosure, the thickness of each of the DBB 300, the CBB 400, the TFPB 504 and the BFPB 508 is substantially the same. According to an alternative embodiment of the present disclosure, the thickness for each of the DBB 300 and the CBB 400 is substantially the same and the thickness of each of the TFPB 504 and the BFPB 508 is substantially the same, with the thickness of the DBB 300 and the CBB 400 being greater than the thickness of the TFPB 504 and the BFPB 508. Also as illustrated in FIG. 6, the DBB 300 only includes disk connectors on the front side 310 of the DBB 300. Having only disk connectors on the front side 310 of the DBB, allows for additional venting holes 308 to be placed on the DBB 300. Moreover, the CBB 400 only includes controller connectors on the front side 410 of the CBB 400. Again, having only controller connectors on the front side 410 of the CBB 400, allows for additional venting holes 424, 428, 432, 436 to be placed on the CBB 400.

As further illustrated in FIG. 6, the bridge connectors 330 of the DBB 300 and the bridge connectors 460 of the CBB 400 are provided at top and bottom portions of the rear side 350 of the DBB 300 and the rear side 450 of the CBB 400 extending in the horizontal direction. With this arrangement of the bridge connectors 330 and 460, none of the venting holes 308 are blocked by the bridge connectors. According to an alternative embodiment of the present disclosure, the TFPB 504 and the BFPB 508 can be replaced with cables.

Figure 7:
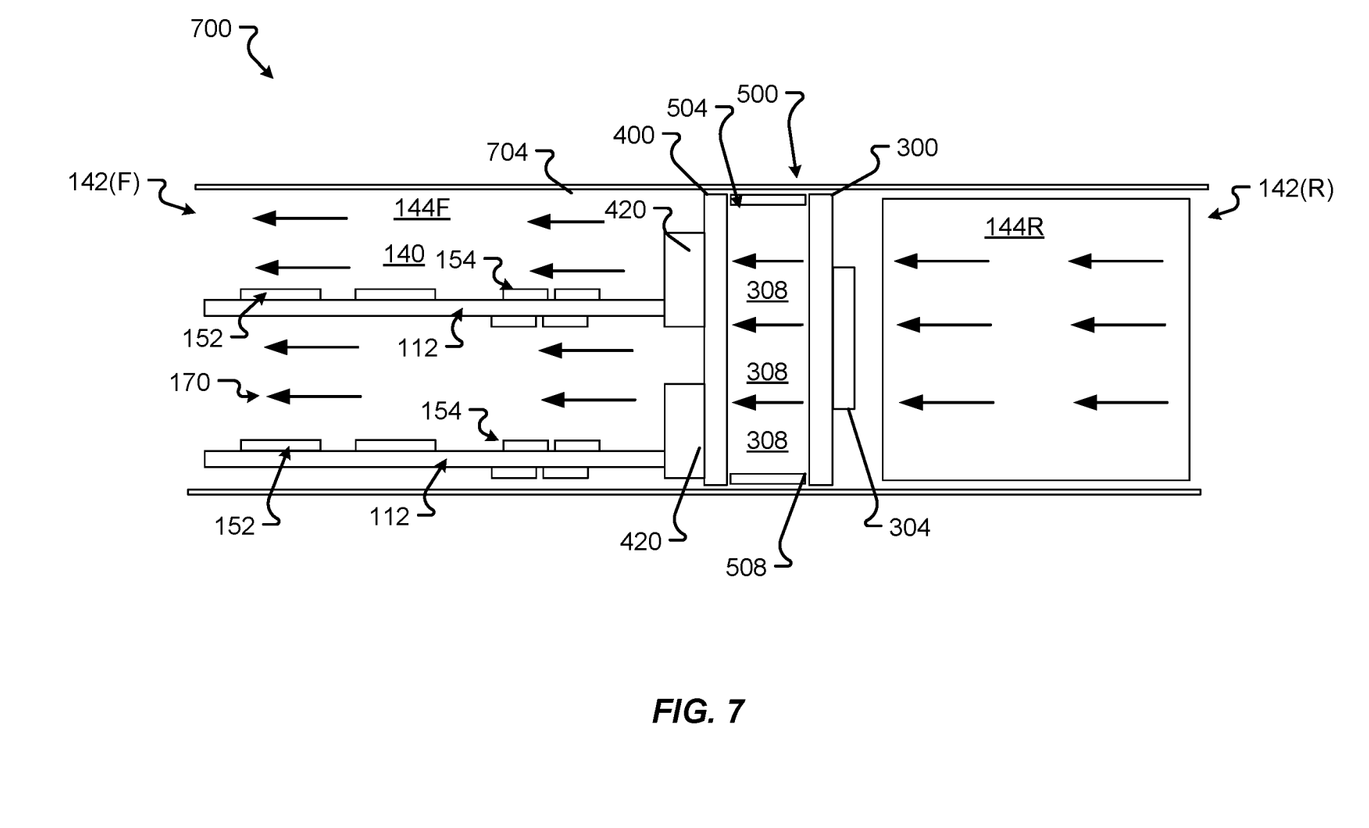
FIG. 7 is a cross-sectional side view of an electronic system incorporating the multi-board mid-plane illustrating airflow and connectors according to an embodiment of the present disclosure.

FIG. 7 is a cross-sectional side view of an electronic system 700 incorporating the multi-board mid-plane 500 illustrating airflow and connectors according to an embodiment of the present disclosure. As illustrated in FIG. 7, the multi-board mid-plane 500 includes the TFPB 504 and the BFPB 508 provided between the DBB 300 and the CBB 400. As illustrated, the DBB 300 includes disk connectors 304 provided on the front surface of the DBB 300 and the CBB 400 includes controller connectors 420 provided on the front surface of the CBB 400. The arrangement of the multi-board mid-plane 500 provided within the chassis 704 provides for greater air flow and a higher venting ratio as compared the single-board mid-plane 108.

Figure 8:
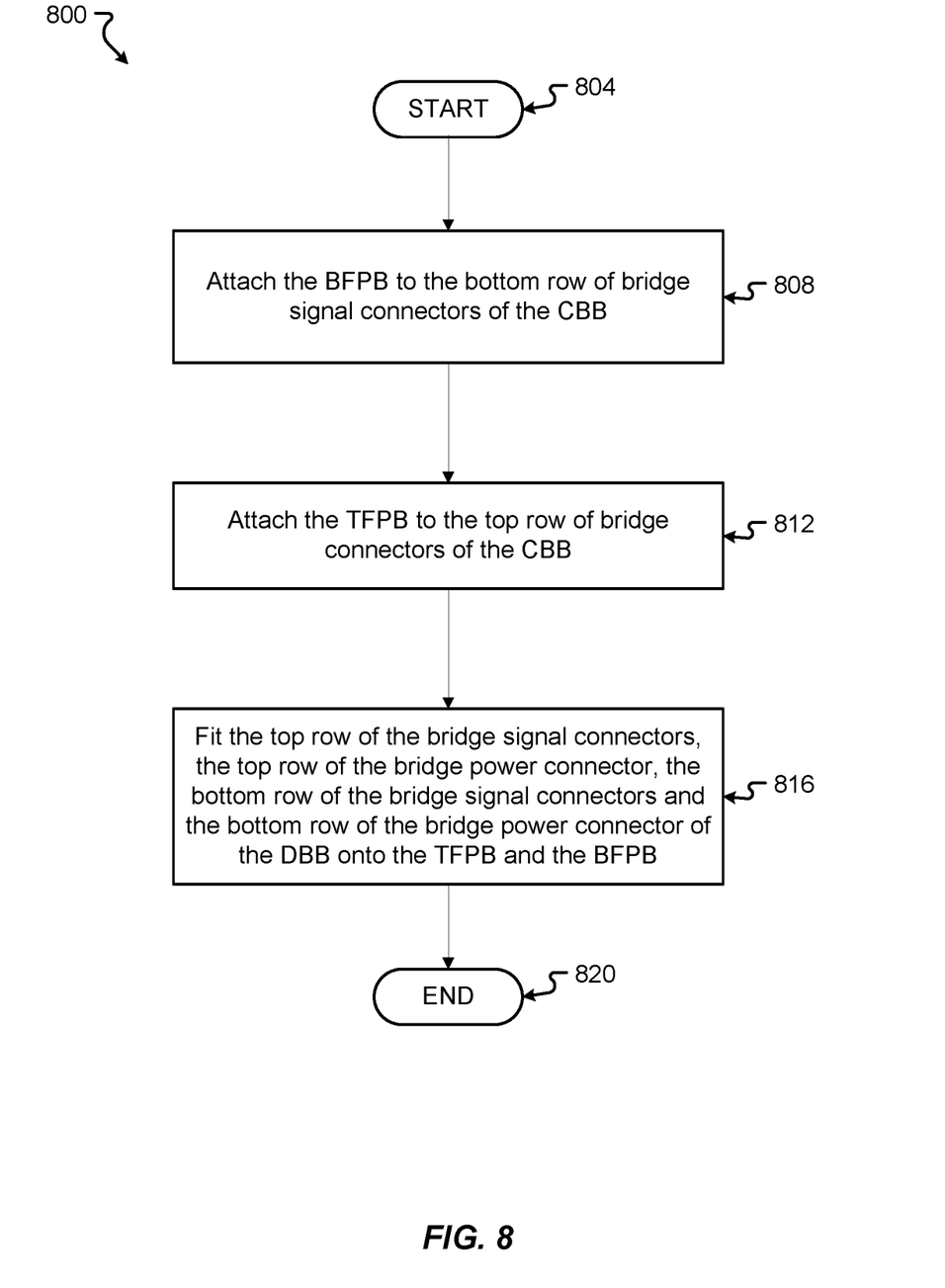
FIG. 8 illustrates a method for assembling a multi-board mid-plane according to one embodiment of the present disclosure.

FIG. 8 illustrates a method 800 for assembling a multi-board mid-plane according to one embodiment of the present disclosure. While a general order of the steps of method 800 is shown in FIG. 8, method 800 can include more or fewer steps or can arrange the order of the steps differently than those shown in FIG. 8. Further, two or more steps may be combined into one step. Generally, method 800 starts with a START operation 804 and ends with an END operation 820. Hereinafter, method 800 illustrated in FIG. 8 may be carried out by various known manufacturing techniques in addition to techniques described herein. The method 800 illustrated in FIG. 8 shall be explained with reference to systems, components, modules, etc. described in conjunction with FIGS. 1-7.

Method 800 may begin at START operation 804 and proceed to step 808, where the BFPB is attached to the bottom row of bridge signal connectors of the CBB. After the BFPB is attached to the bottom row of bridge signal connectors of the CBB at step 808, method 800 proceeds to step 812, where the TFPB is attached to the top row of bridge connectors of the CBB. After the TFPB is attached to the top row of the bridge connectors of the CBB at step 812, method 400 proceeds to step 816, where the top row of the bridge signal connector, the top row of the bridge power connector, the bottom row of the bridge signal connectors and the bottom row of the bridge power connector of the DBB are fitted onto the TFPB and the BFPB. After the top row of the bridge signal connectors, the top row of the bridge power connector, the bottom row of the bridge signal connectors and the bottom row of the bridge power connector of the DBB are fitted onto the TFPB and the BFPB at step 816, method 800 ends at END operation 820.

The present disclosure, in various aspects, embodiments, and/or configurations, includes components, methods, processes, systems, and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A multi-board mid-plane, comprising:
a disk backplane board (DBB) having a front side and a rear side,
wherein the front side of the DBB includes slots for accommodating disk connectors and the rear side of the DBB includes slots for accommodating bridge connectors, and
wherein venting holes are provided within the DBB extending between the front side of the DBB and the rear side of the DBB;
a controller backplane board (CBB) having a front side and a rear side,
wherein the front side of the CBB includes slots for accommodating controller connectors and the rear side of the CBB includes slots for accommodating bridge connectors, and
wherein venting holes are provided within the CBB extending between the front side of the CBB and the rear side of the CBB; and
a connector for connecting the DBB with the CBB,
wherein a combination of the DBB and the CBB has a venting ratio that is equal to a lower of the venting ratio of the DBB and the venting ratio of the CBB.

2. The multi-board mid-plane of claim 1, wherein the connector for connecting the DBB with the CBB includes a top fabric plane board (TFPB) and a bottom fabric plane board (BFPB).

3. The multi-board mid-plane of claim 2, wherein the TFPB and the BFPB are provided between the DBB and the CBB adjacent to the rear side of the DBB and the rear side of the CBB.

4. The multi-board mid-plane of claim 2, wherein the DBB and the CBB are rigid.

5. The multi-board mid-plane of claim 4, wherein the TFPB and the BFPB are each less rigid than each of the DBB and the CBB.

6. The multi-board mid-plane of claim 1, wherein the bridge connectors for the CBB include bridge signal connectors.

7. The multi-board mid-plane of claim 2, wherein the TFPB and the BFPB each includes electrical signal trace routing channels.

8. The multi-board mid-plane of claim 1, wherein the venting ratio of the DBB is around 28.20%.

9. The multi-board mid-plane of claim 1, wherein the venting ratio of the CBB is around 36.90%.

10. The multi-board mid-plane of claim 1, wherein the venting ratio for the combination of the DBB and CBB is around 28.20%.

11. The multi-board mid-plane of claim 2, wherein the TFPB and the BFPB provide mechanical and electrical interfaces between the DBB and the CBB.

12. The multi-board mid-plane of claim 1, wherein the bridge connectors for the DBB include bridge signal connectors and bridge power connectors.

13. A method for assembling a multi-board mid-plane, comprising:
attaching a bottom fabric plane board (BFPB) to a bottom row of bridge signal connectors of a controller backplane board (CBB),
wherein the CBB has a front side and a rear side;
providing venting holes within the CBB extending between the front side of the CBB and the rear side of the CBB;
attaching a top fabric plane board (TFPB) to a top row of bridge signal connectors of the CBB;
fitting a top row of bridge signal connectors, a top row of bridge power connectors, a bottom row of bridge signal connectors and a bottom row of bridge power connectors of a disk backplane board (DBB) onto the TFPB and the BFPB,
wherein the DBB has a front side and a rear side; and
providing venting holes within the DBB extending between the front side of the DBB and the rear side of the DBB,
wherein a combination of the DBB and the CBB has a venting ratio that is equal to a lower of the venting ratio of the DBB and the venting ratio of the CBB.

14. The method for assembling the multi-board mid-plane of claim 13, further comprising:
attaching controller connectors on the front side of the CBB opposite the rear side of the CBB where the bridge signal connectors are provided; and
attaching disk connectors on the front side of the DBB opposite the rear side of the DBB where the bridge signal connectors and the bridge power connectors are provided.

15. The method for assembling the multi-board mid-plane of claim 14, wherein the TFPB and the BFPB are provided between the DBB and the CBB adjacent to the rear side of the DBB and the rear side of the CBB.

16. The method for assembling the multi-board mid-plane of claim 13, wherein the DBB and the CBB are rigid.

17. The method for assembling the multi-board mid-plane of claim 16, wherein the TFPB and the BFPB are each less rigid than each of the DBB and the CBB.

18. The method for assembling the multi-board mid-plane of claim 13, wherein the venting ratio for the combination of the DBB and the CBB is around 28.20%.

19. The method for assembling the multi-board mid-plane of claim 14, wherein the TFPB and the BFPB each includes electrical signal trace routing channels.

20. A multi-board mid-plane, comprising:
a disk backplane board (DBB) having a front side and a rear side,
wherein venting holes are provided within the DBB extending between the front side of the DBB and the rear side of the DBB;
a controller backplane board (CBB) having a front side and a rear side,
wherein venting holes are provided within the CBB extending between the front side of the CBB and the rear side of the CBB; and
a top fabric plane board (TFPB) and a bottom fabric plane board (BFPB) for connecting the DBB with the CBB,
wherein a combination of the DBB and the CBB has a venting ratio that is equal to a lower of the venting ratio of the DBB and the venting ratio of the CBB.

* * * * *